United States Patent

Gademann et al.

[11] Patent Number: 5,940,279
[45] Date of Patent: Aug. 17, 1999

[54] METAL SUPPORT ELEMENT FOR ELECTRONIC COMPONENTS OR CIRCUIT SUPPORTS

[75] Inventors: Lothar Gademann, Rottenburg; Franz Schmich, Pfullingen; Reinhold Danner, Rottenburg; Bernd Maihoefer, Reutlingen, all of Germany

[73] Assignee: Robert Bosch GmbH, Stuttgart, Germany

[21] Appl. No.: 08/869,196

[22] Filed: Jun. 4, 1997

[30] Foreign Application Priority Data

Sep. 30, 1996 [DE] Germany .................... 196 40 466

[51] Int. Cl.$^6$ ........................................... H01R 9/24
[52] U.S. Cl. .................. 361/823; 361/807; 174/50.61; 174/152 GM; 439/935; 29/842; 29/884
[58] Field of Search ................... 361/807, 823; 257/697, 698, 699, 708, 710, 711, 731; 439/935; 174/152 GM, 50.61; 29/842, 884; 438/121

[56] References Cited

U.S. PATENT DOCUMENTS

| | | | |
|---|---|---|---|
| 2,916,604 | 12/1959 | Doelp, Jr. .......................... | 257/708 |
| 4,960,391 | 10/1990 | Beinhaur et al. .................. | 439/935 |
| 5,053,853 | 10/1991 | Haj-Ali-Ahmadi et al. ........ | 257/698 |
| 5,109,594 | 5/1992 | Sharp et al. ....................... | 257/698 |
| 5,434,358 | 7/1995 | Glahn et al. ....................... | 257/699 |
| 5,595,514 | 1/1997 | Romano et al. ................... | 439/935 |

FOREIGN PATENT DOCUMENTS

| | | | |
|---|---|---|---|
| 60-7753 | 1/1985 | Japan ................................. | 257/697 |
| 04-179254 | 6/1992 | Japan ................................. | 257/708 |
| 05-160578 | 6/1993 | Japan ................................. | 257/708 |
| 2 107 533 | 4/1983 | United Kingdom . | |

OTHER PUBLICATIONS

"Hybrid integration: technology and design of thick–film circuits" 2nd edition, Alfred Hüthig Verlag, Heidelberg 1988, pp. 263–269.

*Primary Examiner*—Leo P. Picard
*Assistant Examiner*—John B. Vigouski
*Attorney, Agent, or Firm*—Kenyon & Kenyon

[57] ABSTRACT

A metal support element having electronic components or circuit supports, in particular hybrid circuits, the connections of which are guided through from the component side, via a plurality of connector pins melted into glass passthroughs, to the opposite side of the support element. The connector pins are glass-mounted into pin blocks produced independently of the support element. The pin blocks are inserted into associated cutouts of the support element and fastened therein. The arrangement and number of the connector pins in the pin blocks can thereby be flexibly adapted to particular requirements with no need for modifications to the design of the support element. The material and the geometrical properties of the pin blocks can be optimally adapted to the glass-mounting process of the connector pins, while the material of the support element can be matched to the coefficient of thermal expansion of the attached circuit support.

4 Claims, 2 Drawing Sheets

METAL SUPPORT ELEMENT FOR ELECTRONIC COMPONENTS OR CIRCUIT SUPPORTS

BACKGROUND INFORMATION

It is known to apply individual heat-generating electronic components or electronic circuit supports, such as hybrid circuits, circuit boards, or microhybrids, onto a metal support element for better heat dissipation. For example, the document "Hybrid integration: technology and design of thick-film circuits," 2nd edition, Alfred Hüthig Verlag, Heidelberg 1988, pp. 263–269, describes housings for hybrid circuits whose bases are constituted by a metal support element. Arranged on the component side of the support element is a hybrid circuit, the electronic connections of which are guided, via insulated passthroughs, from the component side to the opposite outer side of the support element. The insulated passthroughs are arranged either in the base or in side walls of the support element, and are configured in the form of glass passthroughs. For this purpose, a preformed sintered glass element is melted into each passthrough hole of the support element, and a connector pin is melted in turn into the hole. The connector pins project slightly beyond the support element on both sides of it. The portion of the connector pins projecting from the component side is joined via bonding wires to the hybrid circuit, and is coated with noble metals, using a galvanic or electroless method, in order to allow good wire bondability. If the hybrid circuit is to be encapsulated in a hermetically sealed housing, a cover cap is placed on the support element and welded or soldered thereto, so that the hybrid circuit is enclosed in a gas-tight fashion in the space between support element and cover cap.

A disadvantage of the known art is that the connector pins are glass-mounted directly in the metal support element. The material of the support element must be adapted to the glass-mounting process so that only minor mechanical stresses occur between metal and glass in the event of thermal stress. The thermal expansion coefficient of the support element is defined thereby, and cannot be further adapted to the particular requirements of the component or circuit support placed on it. Such adaptation is required, however, in order to allow optimum heat dissipation and prevent damage to or crushing of the component or circuit support in the event of thermal stress. A further disadvantage is that the entire support element must be very strongly heated in the process of glass-mounting the connector pins. The support element can deform at the high temperatures required to melt the glass. In addition, the number of glass passthroughs manufactured with each melting operation in the furnace is disadvantageously limited by the space requirement of the support elements in the melting furnace. It is furthermore disadvantageous that, when the connector pins are surface-coated, either the entire surface of the metal support is plated, or very complex and expensive selective coating methods are required in order to gold-plate only the connector pins.

SUMMARY OF THE INVENTION

The support element according to the present invention possesses the advantage that the connector pins are glass-mounted into pin blocks that can be manufactured independently of the support element and can be attached flexibly in cutouts of the support element provided for the purpose. The arrangement and number of the connector pins in the block can be adapted to particular requirements with no need for modifications to the design of the support element. The material and the geometrical properties of the pin blocks can be optimally adapted to the glass-mounting process for the connector pins, while the material of the support element can be matched to the coefficient of thermal expansion of the circuit support being applied. It is thus possible, for example, to produce the pin blocks from an alloy such as Kovar, and the support element, economically, from stainless steel.

It is further advantageous that the support element does not need to be heated for manufacture of the glass passthroughs in the melting furnace, so that undesirable deformation is avoided. Since the pin blocks occupy much less space in the melting furnace than the large support elements, the overall result is that more glass passthroughs can be produced with each working cycle in the melting furnace. This allows a considerable cost saving in producing the glass passthroughs.

It is also advantageous to protect the components or circuit supports installed on the support element by means of a protective cap. To produce a hermetically sealed housing, the cap can be joined in gas-tight fashion to the support element in a peripheral attachment region, while the cutouts with the pin blocks are sealed in gas-tight fashion, so that the components or circuit supports are encapsulated in hermetically sealed fashion in the space between cap and support element.

Advantageously, the pin blocks are made of Kovar, which allows optimum adaptation of the coefficient of thermal expansion of the pin blocks to the coefficient of expansion of the glass passthroughs.

Advantageously, the pin blocks are welded, adhesively bonded, or soldered into place in the associated cutouts, since these joining technologies are economical and are particularly suited for the production of hermetically sealed housings.

It is particularly advantageous that, in the production of the support element, surface plating of the connector pins can be performed much more economically because the connector pins mounted in the pin blocks are plated but the surface of the support element is not, and also because expensive methods to prevent coating of the support element are not required.

DETAILED DESCRIPTION

Figure 1:
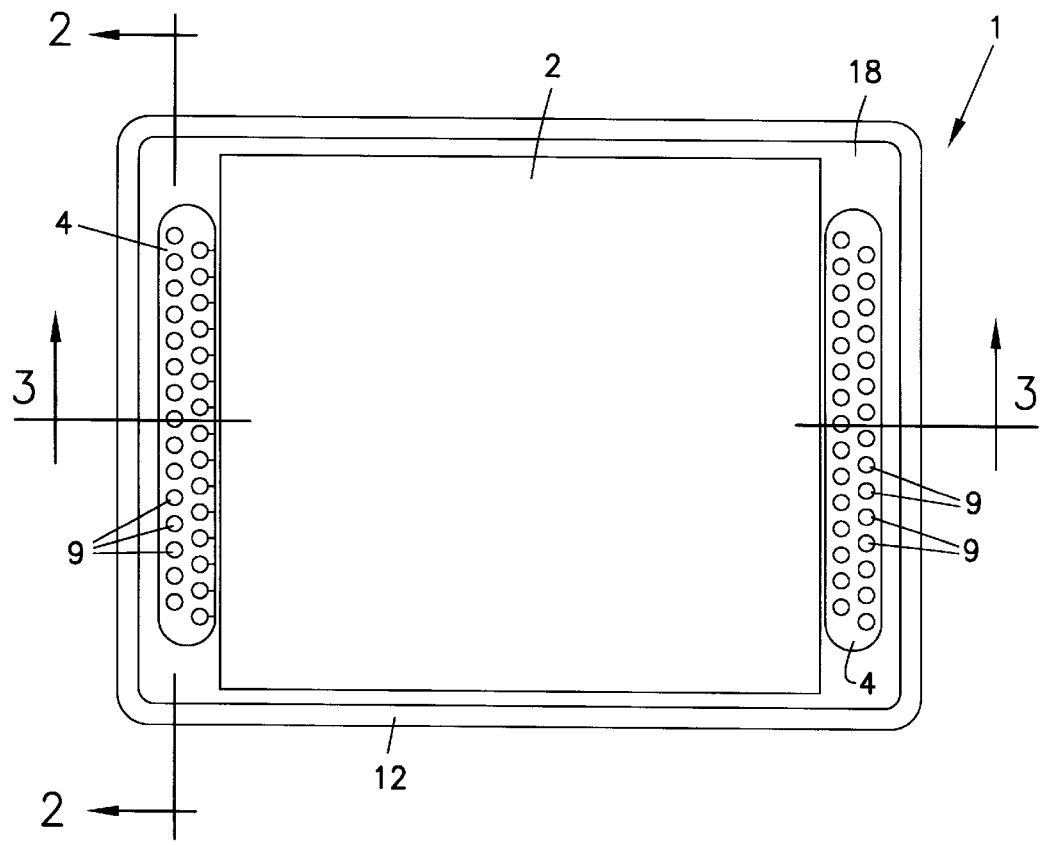
FIG. 1 shows a plan view of the component side of the support element according to the present invention.

FIG. 1 depicts a plan view of a rectangular support element 1, made of stainless steel, having an upper side 18 provided as the component side. Support element 1 constitutes the base plate of a hermetically sealed housing. The edge of plate-shaped support element 1 is equipped with a peripheral flange 12, projecting outward parallel to underside 19 of support element 1, for attachment of a housing cap 3. In the exemplary embodiment shown here, a hybrid circuit 2 is adhesively bonded onto component side 18 of support element using a thermally conductive adhesive. It is equally possible, however, to populate the support element with a multi-layer microhybrid circuit, a circuit board, or an individual electronic component, for example an IC.

Figure 2:
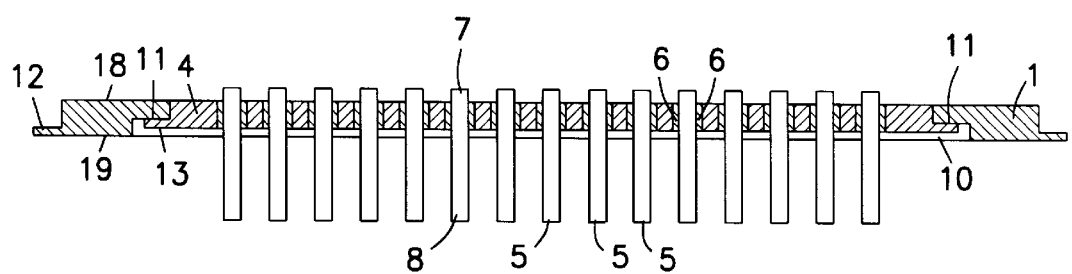
FIG. 2 shows a cross section through the metal support element along the line labeled B—B in FIG. 1.

As depicted in FIG. 1 and FIG. 2, two cutouts 10, into each of which a metal pin block 4 is introduced, are provided in the region of support element 1 not covered by hybrid circuit 2. Pin blocks 4 are made of Kovar, an alloy of iron, nickel, and cobalt, and are each equipped with two rows of passthrough holes 9. Pin blocks 4 can be produced as simple punched parts. As depicted in FIG. 2, a cylindrical connector pin 5 made of Kovar, which projects with a short end 7 from component side 18 and with a long end 8 from underside 19 of support element 1, is provided in each passthrough hole 9. A glass filling 6 composed of sintered glass is introduced in known fashion between each connector pin 5 and the inner wall of the associated passthrough hole, so that connector pins 5 are held in the passthrough holes in insulated fashion. At the same time, the passthrough holes are hermetically sealed by glass filling 6. Pin blocks 4 have a somewhat greater thickness than plate-shaped support element 1, and are equipped at their edge with a peripheral flange 13 which extends in a plane and parallel to the underside of pin blocks 4. Shaped onto the inner wall of each cutout 10 is a peripheral step 11, so that the opening of cutout 10 facing component side 18 is smaller than the opposite opening on underside 19. The contour of the inner wall of each cutout 10 is adapted to the contour of the outer edge of the pin blocks with the shaped-on flange 13. Pin blocks 4 can be inserted into cutout 10 from underside 19. Peripheral step 11 shaped onto the inner wall of each cutout 10 thereby constitutes a stop for the peripheral flange 13 of pin blocks 4, so that the side of flange 13 facing component side 18 rests in closed fashion in a peripheral region on the underside of step 11. The opening of cutout 10 facing component side 18 is closed off by the upper side of pin block 4.

Pin blocks 4 are fastened into the cutouts by welding, soldering, or adhesive bonding. In the exemplary embodiment shown here, flange 13 of pin blocks 4 is welded to step 11 in the peripheral attachment region between the upper side of flange 13 and the underside of step 11, using the resistance welding method, so that cutouts 10 are closed off in hermetically sealed fashion. Ends 7 of connector pins 5 pointing toward component side 18 are connected in known fashion, by means of bonding wires made of gold (not depicted in FIGS. 1 to 3), to the corresponding contacts of hybrid circuit 2.

Figure 3:
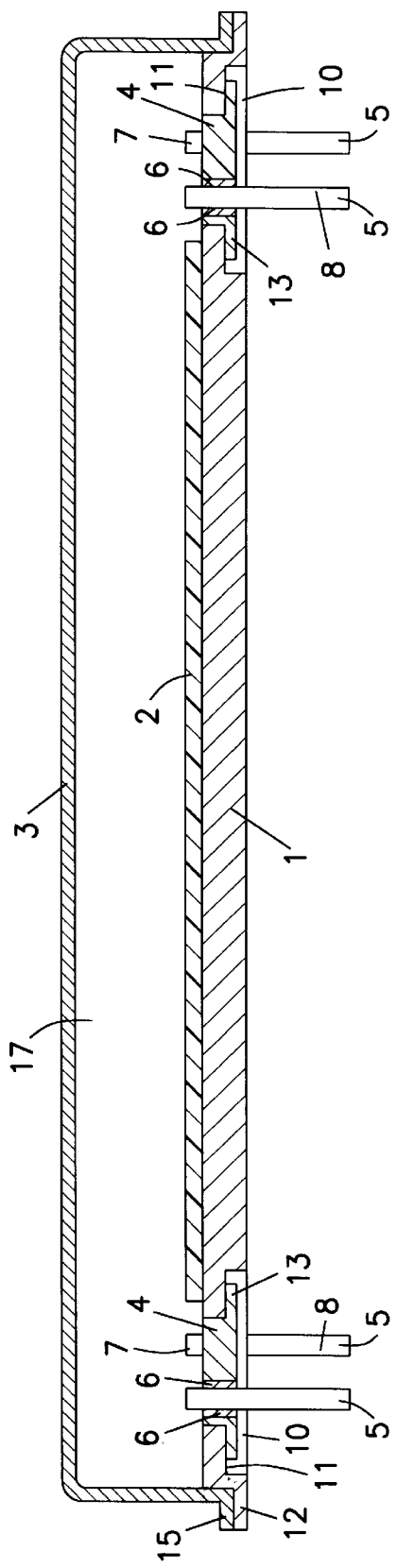
FIG. 3 shows a cross section through the metal support element with the cap in place, along the line labeled A—A in FIG. 1.

As depicted in FIG. 3, hybrid circuit 2 is covered by a cap 3. Cap 3 is fabricated from metal as a deep-drawn housing cover. The edge of cap 3 is equipped with a flanged rim 15. Cap 3 is placed with flanged rim 15 on peripheral flange 12 of support element 1 and welded thereto, so that the hybrid circuit is encapsulated in hermetically sealed fashion in space 17 between cap 3 and support element 1.

Deviating from the exemplary embodiment shown here, it is also possible to equip metal support element 1 with shaped-on side walls, and to seal it with a flat cover cap. In this case, the inner side of the trough-shaped support element 1 is provided as component side 18 for hybrid circuit 2. Cutouts 10 for pin blocks 4 can be provided in the side walls of the support element, so that connector pins 5 glass-mounted into pin blocks 4 emerge laterally from the support element.

The procedure for producing the support element is as follows: Pin blocks 4, made of Kovar, are first equipped with connector pins 5 melt-mounted into glass passthroughs 6. Since the pin blocks occupy much less space in the melting furnace than the large support elements 1, more connector pins can be glass-mounted into passthrough holes with each melting operation in the furnace; production costs can be decreased as a result. After the completion of the glass-mounting process, connector pins 4 are coated with a thin layer of gold in a galvanic or electroless plating process. The gold layer increases the corrosion resistance and bondability of the connector pins. Pin blocks 4 are then inserted into cutouts 10 of support element 1 and welded to the support element using the resistance welding method. Hybrid circuit 2 is then adhesively bonded onto support element 1 using a thermally conductive adhesive, and connected to short ends 7 of connector pins 4 with gold wires, using the thermosonic bonding method. Lastly, cover cap 3 is placed onto flange 12 of support element 1 and joined thereto using the resistance welding method.

What is claimed is:

1. A metal support element having a first side, a second side opposite the first side and a cutout, the metal support element comprising:

at least one pin block gas-tight mounted and one of welded, adhesively bonded and soldered within the cutout, the at least one pin block having a plurality of passthroughs extending from the first side to the second side, the at least one pin block composed of Kovar;

a plurality of connector pins for guiding through connections from the first side to the second side, each of the connector pins being sealed within a glass filling within a corresponding one of the passthroughs, the connections being associated with at least one of electronic components and circuit supports mounted on the first side, the at least one of the electronic components and the circuit supports including hybrid circuits; and a cap composed of a metal material and covering the at least one of the electronic components and the circuit supports on the first side, the cap being gas-tight mounted to a peripheral attachment region of the support element for encapsulating, in a hermetically-sealed manner, the at least one of the electronic components and the circuit supports under the cap.

2. The metal support element according to claim 1, wherein a first portion of each of the connector pins is sealed in the corresponding one of the passthroughs, wherein a second portion of each of the connector pins is at least partially coated with a noble metal in at least one of an electroless manner and a galvanic manner, and wherein the second portion is different from the first portion.

3. The metal support element according to claim 1, wherein the at least one pin block is introduced directly into the cutout.

4. The metal support element according to claim 1, wherein the metal material is a pure metal material.

* * * * *